United States Patent [19]

Taniuchi et al.

[11] Patent Number: 4,554,449

[45] Date of Patent: Nov. 19, 1985

[54] FIBER OPTIC MAGNETIC FIELD SENSOR

[75] Inventors: Tetsuo Taniuchi, Katano; Yoshinobu Tsujimoto, Kashiwara, both of Japan

[73] Assignee: Matsushita Electric Industrial Co., Ltd., Kadoma, Japan

[21] Appl. No.: 490,136

[22] Filed: Apr. 28, 1983

[30] Foreign Application Priority Data

Apr. 30, 1982 [JP] Japan .................................. 57-73603

[51] Int. Cl.⁴ ............................................... G02B 5/14
[52] U.S. Cl. ...................................... 250/227; 324/96; 350/96.13
[58] Field of Search .............................. 250/225, 227; 350/96.13, 374, 375; 356/351, 368; 324/96

[56] References Cited

U.S. PATENT DOCUMENTS

| 3,679,974 | 7/1972 | Mollenbeck | 324/96 |
| 4,221,460 | 9/1980 | Hepner et al. | 350/96.13 |
| 4,356,448 | 10/1982 | Brogardh et al. | 324/96 |
| 4,375,910 | 3/1983 | Seki | 350/375 |

Primary Examiner—David C. Nelms
Assistant Examiner—J. Gatto
Attorney, Agent, or Firm—Spencer & Frank

[57] ABSTRACT

A fiber optic magnetic field sensor employing Faraday effect. The sensor has two pieces of birefringent substance interposed between the ends of optical fibers and a rod lens for effecting polarization separation. In addition, the sensor employs a reflex optical system in which light reciprocates through a Faraday material. Thereby, a magnetic field sensor has been realized which is more compact and lightweight and lower in cost as well as more accurate.

9 Claims, 5 Drawing Figures

FIBER OPTIC MAGNETIC FIELD SENSOR

BACKGROUND OF THE INVENTION

The present invention relates to a fiber optic magnetic field sensor and more particularly to a fiber optic magnetic field sensor employing the Faraday effect.

For measuring a magnetic field in a highvoltage apparatus in which the electromagnetic induction noise, electrical insulating quality and the like are matters of great concern, a magnetic field sensor employing an optical method is more advantageous than a magnetic field sensor employing an electrical method from the viewpoint of measuring accuracy and cost.

FIGS. 1a and 1b show arrangements of conventional magnetic field sensors employing an optical method, respectively. Each of the sensors detects a magnetic field intensity as a light intensity signal by employing a Faraday material member 1, optical fibers 2, 3 for optical signal transmission, rod lenses 4, 5 and polarizing prisms 6, 7. The sensor shown in FIG. 1a is formed by arranging the above-mentioned elements in series, while the sensor shown in FIG. 1b is formed by arranging the elements into a reflection type sensor through the use of a mirror 8.

The operation of the magnetic field sensor shown in FIG. 1a will be described hereinunder. When no magnetic field H is applied to the Faraday material member 1, the plane of poralization of a light beam passing through the Faraday material member 1 does not rotate so that the light beam from a light source passes through the optical fiber 2, lens 4, poralizing prisms 6, 7 having the polarizing axes thereof making an angle of 45° with respect to each other, lens 5 and optical fiber 3 and is sensed by a photo receiver connected to the optical fiber 3. In such a case, the reduction in quantity of light is only the portion of light attenuated in each of the above-mentioned elements.

On the other hand, in the case where the magnetic field H is applied to the Faraday material member 1, when the light beam linearly polarized by the polarizing prism 6 passes through the Faraday material member 1, the plane of poralization of the passing light beam rotates by an angle $\phi$ proportional to the intensity of the magnetic field H. The larger the rotational angle $\phi$, the larger the change in quantity of light passing through the polarizing prism 7. The amount of the change is detected by the photo receiver. Accordingly, the intensity of the magnetic field H can be measured from the change in quantity of light.

Both magnetic field sensors shown in FIGS. 1a and 1b require the rod lenses 4, 5 for transforming the light beam from the optical fiber 2 into a parallel light-ray beam and the polarizing prisms 6, 7 for linearly poralizing the light beam, e.g., Glan-Thomson prisms made of calcite, disposed at both the incident and emergent side of the Faraday material member 1, respectively, so that it is difficult to make the sensor unit more compact and lightweight. More specifically, both sensors shown in FIGS. 1a and 1b include the optical fibers 2, 3 having the rod lenses 4, 5 connected thereto respectively and hence require two lenses, together with two independent prisms completely separate from each other. Therefore, the arrangement of each of the sensors is unfavorable for miniaturization and reduction in cost. Moreover, the conventional polarizing prisms 6, 7 employ calcite as the material therefor, each using a set of two pieces of calcite triangularly cut in accordance with a specific crystalline orientation and cemented together. Consequently, miniaturization and mass production are difficult, so that the cost is inevitably extremely high.

SUMMARY OF THE INVENTION

Accordingly, a first object of the invention is to realize a magnetic field sensor which is more compact and lightweight as well as lower in cost, by reducing the number of optical parts employed therefor.

A second object of the invention is to devise a novel arrangement of a magnetic field sensor with respect to which the two-wavelength multiplex transmission system is applicable, thereby to improve the measuring accuracy.

To these ends, according to the invention, there is provided a fiber optic magnetic field sensor comprising: optical fibers for guiding light beams; a rod lens; two pieces of birefringent substance disposed between one end of the optical fibers and one end of the rod lens; a Faraday material member having one end attached to the other end of the rod lens; and a reflecting means disposed on the other end of the Faraday material member.

The above and other objects, features and advantages of the invention will be apparent from the following description taken in connection with the accompanying drawings.

DESCRIPTION OF THE PREFERRED EMBODIMENTS

A preferred embodiment of the invention will be described hereinunder.

Any conventional arrangement of the magnetic field sensor will not permit miniaturization of its sensor unit. Particularly, in order to utilize the Faraday effect with an excellent linearity, polarization planes of the prisms disposed on the incident and exit sides must be set so as to make an angle of 45°. For this reason, there has hitherto been a need for two lenses and two polarizing prisms each formed by cementing two triangular calcite pieces.

The fiber optic magnetic field sensor according to the invention, however, is provided with a function of polarization separation by interposing two rutile birefringent crystal plates ($TiO_2$ single crystal) between polarization fibers and a rods lens. The optical axes of the afore-mentioned two rutile crystal plates are rotated by 45° from each other, thereby allowing the sensor unit to be constituted by a single rod lens. This makes it possible to reduce the number of the necessary parts as well as make the magnetic field sensor compact and lightweight as compared with the conventional magnetic field sensors.

Figure 2:
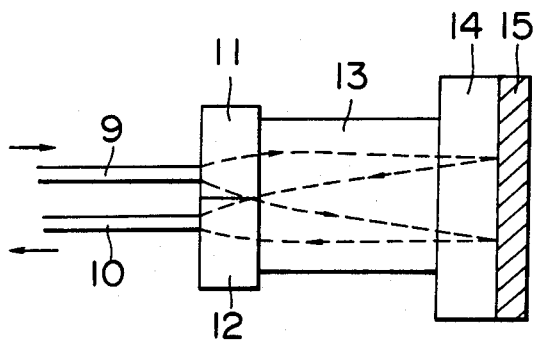
FIG. 2 shows an arrangement of a fiber optic magnetic field sensor in accordance with a first embodiment of the invention.

FIG. 2 shows a fiber optic magnetic field sensor in accordance with a first embodiment of the invention. The fiber optic magnetic field sensor comprises: an incident optical fiber 9 (having a core diameter of 50 μm) and an emergent optical fiber 10 (having a core diameter of 80 μm) which are disposed so that their centers are spaced apart by a distance of 250 μm; two rutile plates 11, 12 having a thickness of 1 mm attached to ends of the fibers 9, 10 respectively; a rod lens 13; a Faraday material member 14; and a mirror 15.

Figure 1A:
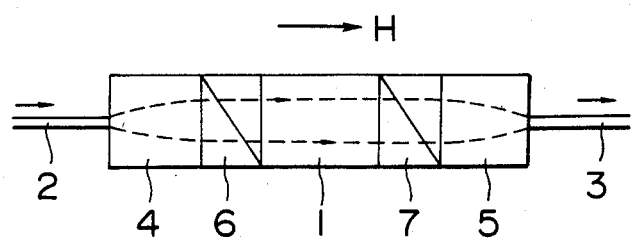
FIGS. 1a and 1b show arrangements of conventional fiber optic magnetic field sensors, respectively.
Figure 1B:
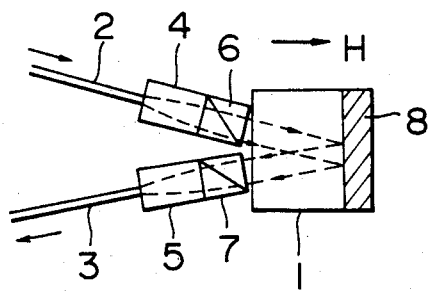
Figure 3:
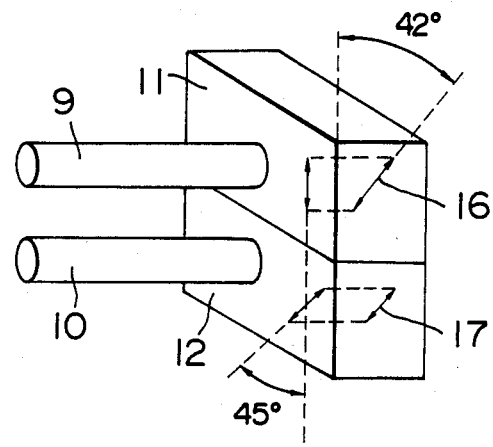
FIG. 3 is an enlarged perspective view of an essential part of the fiber optic magnetic field sensor shown in FIG. 2.

A large difference from the conventional magnetic field sensors is that no polarizing prism is interposed between the lens 13 and the Faraday material member 14; rather the two rutile plates having their polarization axes making an angle of 45° with respect to each other are disposed between the optical fibers 9, 10 and the lens 13. Although prisms using calcite can be employed as the birefringent crystal instead of the rutile plates 11, 12, rutile is superior to calcite in respect of hardness and refraction. Moreover, calcite is apt to cleave and hence is unfavorable from the viewpoint of strength. On the other hand, rutile has a satisfactory mechanical strength, is highly reliable, and hence is extremely favorable. The rutile plates 11, 12 are used for effecting polarization separation. As shown in FIG. 3, the rutile plates 11, 12 are cut so that their polarization axes 16, 17 have an inclination of about 42° with respect to the heightwise direction thereof. Each of the rutile plates 11, 12 has a thickness of 1 mm and is designed so as to deflect the extraordinary ray of about 100 μm at its emerging surface. In addition, the polarization axes of the rutile plates 11 and 12 are set to a 45° offset from each other thereby to permit a Faraday rotation to be converted into an intensity of light with excellent linearity. Moreover, according to the invention, the two rutile plates 11, 12 are bonded to a single lens 13. Therefore, the rutile plates 11, 12 can be disposed in contact with each other, which is advantageous for further miniaturization. In the conventional sensor shown in FIG. 1a, the size of the sensor unit excluding the fibers is, e.g., 5 mm (diameter) by 30 mm (length), while that of the conventional sensor shown in FIG. 1b is, e.g., 10 mm (diameter) by 20 mm (length). The sensor according to the invention shown in FIG. 2, however, can be largely miniaturized: on the order of 2 mm (diameter) by 7 mm (length).

The operation of the fiber optic magnetic field sensor shown in FIG. 2 will be described hereinunder. The light beam emerging from the optical fiber 9 is separated by the rutile plate 11 into the extraordinary ray and the ordinary ray which is then made into a parallel light-ray beam by the rod lens 13 and allowed to pass through the Faraday material member 14, in which the parallel light-ray beam is subjected to a Faraday rotation proportional to the intensity of the applied magnetic field and then reflected by the mirror 15 to pursue the reverse optical path. By adjusting the angle of the mirror 15, the beam is allowed to pass through the rutile plate 12 and focused into the optical fiber 10. The intensity of the light beam entering into the optical fiber 10 is proportional to that of the applied magnetic field. Accordingly, it is possible to detect the intensity of the applied magnetic field from that of the light beam.

It is to be noted that the thickness of each of the rutile plates 11, 12 should be designed in accordance with the diameters of the optical fibers employed so that polarization separation can be effectively performed.

Figure 4:
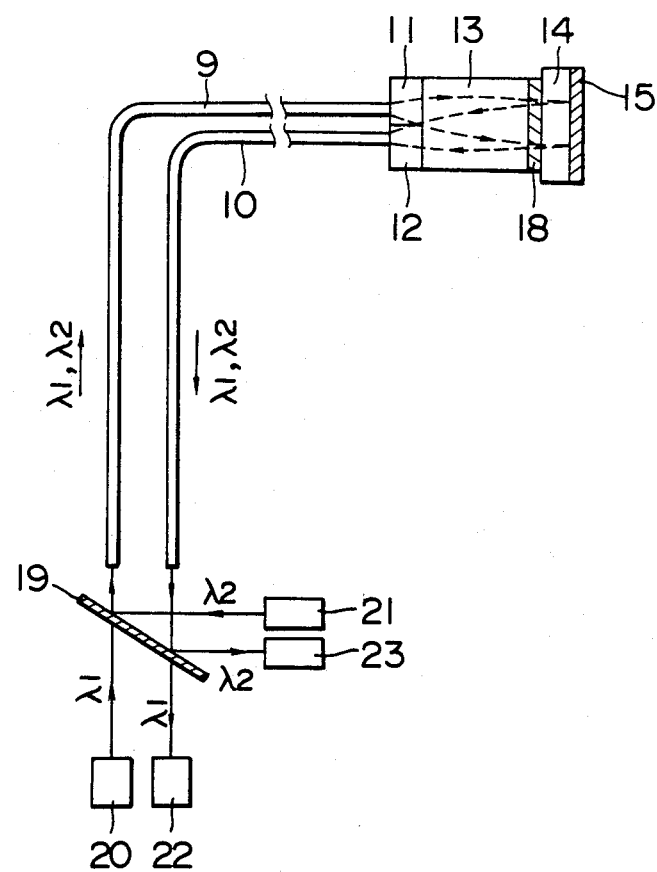
FIG. 4 shows an arrangement of a fiber optic magnetic field sensor in accordance with a second embodiment of the invention.

FIG. 4 shows a fiber optic magnetic field sensor in accordance with a second embodiment of the invention. The sensor is arranged such that a dichroic filter 18 is interposed between the rod lens 13 and the Faraday material member 14 ($Y_3Fe_5O_{12}$) so as to allow light of wavelength $\lambda_1$ to pass through and to reflect light of wavelength $\lambda_2$. The sensor is a highly accurate two-wavelength multiplex magnetic field sensor in which the measuring accuracy is not diminished by any fluctuation of loss or the like in the fiber optic transmission unit by operationally processing the output of light of wavelength $\lambda_1$ passing through the Faraday material member 14 and the output of light of wavelength $\lambda_2$ reflected at the end of the rod lens 13 closer to the dichroic filter 18.

In FIG. 4, a dichroic filter 19 disposed in the light source unit preferably has the same characteristics as those of the dichroic filter 18 in the sensor unit. It is possible to employ as light sources 20, 21, for example, light-emitting diodes which emit light of wavelength $\lambda_1 = 1.3$ μm and light of wavelength $\lambda_2 = 0.88$ μm, respectively, and Ge or Si photodiodes as photo receivers 22, 23. The abovementioned operational processing is effected simply by means of a conventional operational circuit by subtracting and dividing the electrical outputs delivered from the respective photo receivers 22, 23.

The material for the Faraday material member employed in the fiber optic magnetic field sensor according to the invention may include flint glass, paramagnetic glass, rare earth garnet crystal, II–VI group crystal, $Bi_{12}SiO_{20}$ crystal, $Bi_{12}GeO_{20}$ crystal, etc. Single crystals or polycrystals of $(Tb_xY_{1-x})_3Fe_5O_{12}$ ($x \approx 0.1$ to 0.3), ZnS, ZnSe and ZnTe which have excellent in temperature characteristics are particularly favorable. Alternatively, $R_3(FeGa)_5O_{12}$ (R represents any one of Bi, Y, Gd, Sm, Eu, Tb, Dy, Ho, Er, Tm and Yb or any one of mixed crystals thereof) prepared by liquid phase epitaxy or vapor phase epitaxy is also regarded as a favorable Faraday material, since it is easy to regulate the magnetic field detection sensitivity through control of the composition. It is to be noted that when a rare earth garnet crystal is employed, the wavelength of light emitted from the light source should be within the infrared region: around 0.8 μm or from 1.2 μm to 1.6 μm.

As will be fully understood from the foregoing description, the fiber optic magnetic field sensor of the invention has a novel arrangement wherein two rutile plates are interposed between the rod lens and the optical fibers to effect polarization separation. Thus, it is possible to reduce the number of optical parts and miniaturize the sensor unit by using the rod lens in common and making the birefringent substances more compact. Moreover, according to the arrangement of the fiber optic magnetic field sensor of the invention, it is easy to transform the sensor into a twowavelength multiplex sensor by disposing a dichroic filter in front of the Faraday material member. Accordingly, a highly accurate magnetic field sensor is realized in which any fluctuation of loss or the like in the optical fibers will not directly lead to a measuring error.

Although the invention has been described through specific terms, it is to be noted here that the described embodiments are not exclusive and various changes and modifications may be imparted thereto without departing from the scope of the invention which is limited solely by the appended claims.

What is claimed is:

1. A fiber optic magnetic field sensor comprising:
   a light emitting optical fiber, having a light emitting end, for guiding an input light beam;
   a light receiving optical fiber, having a light receiving end, for guiding an output light beam;
   A first rutile plate having a first polarization axis, said first rutile plate having one side surface attached to the light emitting end of said light emitting optical fiber, and a second side surface;
   a second rutile plate, having a second polarization axis making an angle with respect to said first polarization axis, juxtaposed to said first rutile plate, said second rutile plate having one side surface attached to the light receiving end of said light receiving optical fiber, and a second side surface, said one side surfaces of said first and second rutile plates each facing the same direction;
   a rod lens having one end attached to the second side surfaces of both said first and second rutile plates, and a second end;
   a Faraday material member having one end surface attached to the second end of said rod lens, and a second end surface; and
   a reflecting means, attached to the second end surface of said Faraday material member, for reflecting the input light beam toward said light receiving end of said light receiving optical fiber as the output light beam.

2. A fiber optic magnetic field sensor according to claim 1, where the angle made by said first and second polarization axes is 45°.

3. A fiber optic magnetic field sensor according to claim 1, wherein said Faraday material member comprises one of single-crystal and polycrystalline material having a composition selected from the group consisting of ZnS, ZnSe, ZnTe, $Zn(S_xSe_{1-x})$, $Zn(Se_xTe_{1-x})$ and $Zn(S_xTe_{1-x})$ wherein ($0 \leq X \leq 1$).

4. A fiber optic magnetic field sensor according to claim 1 wherein said Faraday material member comprises a rare earth garnet crystal represented by the formula $R_3(Fe_xGa_{1-x})_5O_{12}$, wherein ($0 \leq X \leq 1$) and R is selected from the group consisting of Bi, Gd, T and Tb or any combination thereof.

5. A fiber optic magnetic field sensor comprising:
   a light emitting optical fiber, having a light emitting end, for guiding first and second input light beams having different wavelengths, respectively;
   a light receiving optical fiber, having a light receiving end, for guiding first and second output light beams;
   a first rutile plate having a first polarization axis, said first rutile plate having one side surface attached to the light emitting end of said light emitting optical fiber, and a second side surface;
   a second rutile plate juxtaposed to said first rutile plate and having a second polarization axis making an angle with respect to said first polarization axis, said second rutile plate having one side surface which is attached to the light receiving end of said light receiving optical fiber and which is arranged to face in the same direction as that of said one side surface of said first rutile plate, and a second side surface;
   a rod lens having one end attached to the second side surfaces of both said first and second rutile plates, and a second end;
   a dichroic filter having one side surface attached to the second end of said rod lens and a second side surface, said dichroic filter reflecting said first input light beam toward the light receiving end of said light receiving optical fiber as the first output light beam, and passing therethrough the second input light beam;
   a Faraday material member having one end surface attached to the second side surface of said dichroic filter, and a second end surface; and
   reflecting means attached to the second end surface of said Faraday material member for reflecting the second input light beam toward said light receiving end of said light receiving optical fiber as the second output light beam.

6. A fiber optic magnetic field sensor according to claim 5, wherein the angle made by said first and second polarization axes is 45°.

7. A fiber optic magnetic field sensor according to claim 5, wherein said Faraday material member comprises one of single-crystal and crystalline material selected from the group consisting of ZnS, ZnSe, ZnTe, $Zn(S_xSe_{1-x})$, $Zn(Se_xTe_{1-x})$ and $Zn(S_xTe_{1-x})$, wherein ($0 \leq X \leq 1$).

8. A fiber optic magnetic field sensor according to claim 5, wherein said Faraday material member comprises rare earth garnet crystal represented by the formula $R_3(Fe_xGa_{1-x})_5O_{12}$, wherein ($0 \leq X \leq 1$) and R is selected from the group consisting of Bi, Gd, Y and Tb, or any combination thereof.

9. A fiber optic magnetic field sensor according to claim 5 further comprising: a first photo receiver disposed for receiving the first output light beam reflected by said dichroic filter and passing through said light receiving optical fiber; and a second photo receiver disposed for receiving the second output light beam reflected by said reflecting means and passing through said light receiving optical fiber.

* * * * *